United States Patent [19]

Lindmayer

[11] Patent Number: 4,842,960
[45] Date of Patent: Jun. 27, 1989

[54] HIGH EFFICIENCY PHOTOLUMINESCENT MATERIAL FOR OPTICAL UPCONVERSION

[75] Inventor: Joseph Lindmayer, Potomac, Md.

[73] Assignee: Quantex Corporation, Rockville, Md.

[21] Appl. No.: 78,829

[22] Filed: Jul. 28, 1987

Related U.S. Application Data

[63] Continuation-in-part of Ser. No. 870,809, Jun. 6, 1986, which is a continuation-in-part of Ser. No. 786,095, Oct. 10, 1985, Pat. No. 4,705,952.

[51] Int. Cl.$^4$ .............................................. C09K 11/56
[52] U.S. Cl. ................................ 428/690; 252/301.45
[58] Field of Search ..................... 252/301.45; 428/690

[56] References Cited

U.S. PATENT DOCUMENTS

| | | | |
|---|---|---|---|
| 2,468,452 | 4/1949 | Leverenz | 252/301.45 |
| 2,468,714 | 4/1949 | Leverenz | 252/301.45 |
| 2,485,903 | 10/1949 | Miller | 252/301.45 |
| 2,521,124 | 9/1950 | Miller | 252/301.45 |
| 2,522,074 | 9/1950 | Urbach | 252/301.45 |
| 2,527,365 | 10/1950 | Leverenz | 252/301.45 |
| 2,979,467 | 11/1961 | Keller | 252/301.45 |
| 3,668,142 | 6/1972 | Luckey | 2152/301.4 S |
| 3,767,588 | 10/1973 | Otomo et al. | 252/301.4 H |
| 4,064,066 | 12/1977 | Toshinai et al. | 252/301.4 H |
| 4,211,813 | 7/1980 | Gravisse et al. | 252/301.4 S |
| 4,239,968 | 12/1980 | Kotera et al. | 250/484.1 B |
| 4,258,264 | 3/1981 | Kotera et al. | 250/484.1 B |
| 4,261,854 | 3/1981 | Kotera et al. | 252/301.4 H |
| 4,292,107 | 9/1981 | Tanaka et al. | 427/64 |
| 4,348,299 | 9/1982 | Okamoto et al. | 2152/301.45 |
| 4,365,184 | 12/1982 | Higton et al. | 427/64 |
| 4,510,174 | 4/1985 | Holzapfel et al. | 427/71 |

FOREIGN PATENT DOCUMENTS 8504892 11/1985 PCT Int'l Appl. .
492735 12/1936 United Kingdom .

OTHER PUBLICATIONS

Stripp et al "J. Am. Chem. Soc." vol. 70, 1948 pp. 401–406.
Primak et al "J. Am. Chem. Soc." vol. 69, 1947, pp. 1283–1287.
Keller et al., "Studies on Some Infrared Stimulable Phosphors", *Physical Review*, vol. 108, No. 3, Nov. 1, 1957.
Lindmayer, "IR Phosphors as Sensors", *Sensors*, Mar. 1986.
Mims, "How to See Near . . . IR Radiation", *Modern Electronics*, May 1985, pp. 64–70.

*Primary Examiner*—Jack Cooper
*Attorney, Agent, or Firm*—Ostrolenk, Faber, Gerb & Soffen

[57] ABSTRACT

Photoluminescent materials useful for photonic applications are prepared using a dual base material, first, second and third dopants, and a fusable salt. The base materials are alkaline earth metal sulfides, such as strontium and cerium sulfides. Lithium fluoride is used to enhance the interdiffusion of materials. Samarium, europium and cerium are used together for dopants in providing electron traps. The photoluminescent material is made according to a process involving heating of the material to a fusing temperature. The material is then either ground to particles or is deposited as a thin film for different uses.

7 Claims, 3 Drawing Sheets

HIGH EFFICIENCY PHOTOLUMINESCENT MATERIAL FOR OPTICAL UPCONVERSION

This application is a continuation-in-part of U.S. patent application Ser. No. 870,809 filed June 6, 1986, now U.S. Pat. No. 4,830,875 which is a continuation-in-part of U.S. patent application Ser. No. 786,095 filed Oct. 10, 1985, now U.S. Pat. No. 4,705,952.

This application is also related to the present inventor's U.S. patent application Ser. No. 870,877 filed June 6, 1986, and U.S. patent applications Ser. Nos. 034,332; 034,333; 034,334; 034,497 all filed on Apr. 3, 1987, the latter three of which are now allowed.

BACKGROUND OF THE INVENTION

1. Field of the Invention

This invention relates to electron trapping optical materials and a process for making and using such material.

2. Description of the Prior Art

In order to define the family of materials involved, it is useful to review the history, particularly since sometimes confusion exists over terminology. It is important to begin with the term luminescence, the ability of certain solids to emit light under different conditions.

Luminescence is a long known phenomenon of nature reaching back very far in history. Recorded observations reach back to the last century. Seeback and Becquerel observed momentary visible afterglow in certain materials. In 1889, Klatt and Lenard also observed some effects with infrared. During this time period, words like "phosphor" and "luminescence" appeared. In 1904, Dahms distinquished between "stimulation" and "quenching"; meaning inducing or stopping afterglow. Much of the later work is associated with Lenard, who received the Nobel Prize in 1905 in physics for cathode ray emission. He studied different phosphors until at least 1918. Later work can be found by Urback in 1926 through 1934. These early scientists basically observed very small luminescent effects.

In 1941, a program was instituted by the National Defense Committee for development of light emitting phosphors. The work started at the University of Rochester, and other laboratories become involved; however, the projects ended with World War II. The following technical papers were published on this work between 1946 and 1949:

B. O'Brien "Development of Infrared Phosphors", *J. Opt. Soc. of Am.*, vol. 36, July 1946, p. 369;

F. Urbach, et al., "On Infrared Sensitive Phosphors", *J. Opt. Soc. of Am.*, vol. 36, July 1946, p. 372;

G. Fonda, "Preparation and Characteristics of Zinc Sulfide Phosphors Sensitive to Infra-Red", *J. Opt. Soc. of Am.*, vol. 36, July 1946, p. 382;

A. L. Smith, "The Preparation of Strontium Selenide and its properties as a Base Material for Phosphors Stimulated by Infra-Red", *Journal of the Am. Chem. Soc.*, vol. 69, 1947, p. 1725; and "Preparation and Characteristics of Solid Luminescent Materials", Editors: G. R. Fonda and F. Seitz. John Wiley & Sons, Inc., New York, 1948.

These papers provide an early story on the materials studied, As decades went by, the effects were forgotten by most physicists. Only work in the field of cathodoluminescence for screens of cathode ray tubes and fluorescent lamps continued with any focus.

Thus, the field of luminescence is broad and refers to the ability of certain substances or materials to emit light when driven by an external energy source. When the driving energy source is light, the proper term is photoluminescence.

The most interesting class of materials are those which upon excitation by illumination can store electrons in "traps" for varying lengths of time as discussed by J. L. Summerdijk and A. Bril, in "Visible Luminescence . . . Under I.R. Excitation", Internation Conference on Luminescence, Leningrad, August 1972, p. 86. In the case of deep traps, trapped electrons can be released at a later time by photons having an energy similar to the depth of the trap. Thermal discharging is neglible in the case of deep traps. Under these circumstances, it appears that light has been "stored" for later use and emission of visible light can be activated by infrared. In the case of shallow traps, spontaneous emission will occur at room temperature because the thermal agitation is sufficient to excite electrons out of the traps. These materials are now called electron trapping optical materials.

The fundamentals of electron trapping material are the following: A host crystal is a wide bandgap semiconductor (II–VI) compound, normally without any special value. These crystals, however, can be doped heavily with impurities to produce new energy levels and bands. Impurities from the lanthanide (rare earth) series are some of the elements that can be accomodated in the lattice to form a "communication" band and a trapping level. The new communication band provides an energy band in which the untrapped electrons can interact. The trapping level at yet lower energies represents non-communicating sites.

Materials that display latent luminescent activity often include one or more types of sites where electrons may be trapped in an energized state. Upon application of suitable wavelengths of energizing radiation, such as visible light or x-rays, such sites become filled with electrons. The energizing radiation results in the electrons being raised to an energized state via the communication band from which transitions, such as absorption and recombination, may take place. Upon removal of the energizing radiation, the electrons may be trapped at an energy level higher than their original ground state or may drop back to their original ground state. The number of electrons that become trapped is very much dependent upon the composition of the photoluminescent material and the dopants used therein.

If the trapping level is sufficiently below the level of the communication band, the electrons in them will be isolated from each other, will rmain trapped for a long period of time, and will be unaffected by normal ambient temperatures. Indeed, if the depth of the trap is sufficient, the electrons will remain trapped almost indefinitely unless they are activated by specific light energies, or thermal energy much higher than room temperature.

The electrons will remain trapped until light or other radiation is applied to provide sufficient energy to again raise them to the level of the communication band, where a transition may take place in the form of recombination, allowing the electrons to escape from the trap and release photons of visible light. The material must be such that room temperature thermal energy is insufficient to allow any significant portion of trapped electrons to escape from their traps. As used herein, "optical energy" shall include visible light, infrared light, and ultraviolet light unless otherwise noted, "photoluminescent material" is a material that exhibits the above characteristics.

Although various photoluminescent materials have heretofore been known, the properties have often been less than desirable. For example, photoluminescent materials have been used for locating infrared beams by outputting visible light upon placement of the material within an infrared beam, but such previous photoluminescent materials are not sensitive enough to detect relatively low levels of infrared radiation. The visible light output by such materials is often at a very low level such that detection of the visible light is difficult. Further, such materials commonly have electron traps with insufficient depth and/or a relatively low density of electron traps such that it is difficult to maintain the electrons trapped for extended periods of time. The ratio of the energy of light input to energy of light output in such materials is often quite high. That is, a relatively large amount of energy must be put into the material to provide a given output optical energy. The development of photoluminescent materials that avoid or minimize the disadvantages discussed above would open up numerous other applications for such materials.

SUMMARY OF THE INVENTION

A primary object of the present invention is to provide new photoluminescent materials avoiding or minimizing the disadvantages discussed above.

A more specific object of the present invention is to provide photoluminescent materials having sufficient electron trap depth and sufficient density of electron traps to be useful as an optical memory material.

Another object of the invention is to provide a photoluminescent material that outputs visible light when subjected to infrared radiation.

Another object of the invention is to provide a photoluminescent material that outputs a higher intensity of visible light.

Yet another object of the present invention is to realize a new and improved process for amking photoluminescent materials.

The above and other objects of the present invention which will become more apparent as the description proceeds, are realized by a high performance electron trapping photoluminescent material consisting essentially of two base materials, a first dopant, a second dopant, preferably a third dopant, and a fusable salt where desirable. More specifically, the photoluminescent material comprises: two base materials selected from a group of alkaline earth metal sulfides and alkaline earth metal selenides; a first dopant of samarium; a second dopant selected from the group of europium oxide, europium fluoride, europium chloride, and europium sulfide; a third dopant of similar compositions of cerium; and up to 10 parts fusable salt for every 100 parts of base materials.

Significant improvements in the photoluminescent material result from the unique use of a base material comprising a mixture of two base materials. Additional improvements resulted from the use of a third dopant.

The invention further comprises the photoluminescent material described above disposed upon a substrate. If desired, the photoluminescent material may be applied upon the substrate by use of a transparent binder. Mixing the transparent binder with the photoluminescent material will not significantly affect the optical properties of the photoluminescent material. Reference in this application to "consists essentially of the base materials, first dopant, second dopant, third dopant, and fusable salt" shall be interpreted as including those materials alone or in combination with a transparent binder.

The invention also comprises the photoluminescent material described above, deposited in a thin film form on a suitable substrate, such as sapphire or alumina, and heated to moderate temperatures such as 500 to 800 degrees Celsius. The surface crystals so developed display the photoluminescent properties described above. Reference in this application to "consists essentially of the base materials, first dopant, second dopant, third dopant, and fusable salt" shall be interpreted as including those materials alone or in combination in a crystalline form on a foreign substrate.

The process of the present invention comprises the steps of mixing two base materials, such as strontium sulfide and calcium sulfide, a first dopant of samarium, a second dopant of a europium compound, and a third dopant of a cerium compound; after mixing, heating the resultant mixture to a temperature sufficient to fuse the mixture and allow for diffusion of the different dopants. This first heating step takes place in a furnace with an inert atmosphere and a temperature above 950° C.

A further processing direction comprises the steps of grinding the resultant solid substance into a powder; and after grinding, reheating the resultant powder to a second temperature below the first temperature but, sufficiently high to repair crystal defects in the powder, thereby yielding an electron trapping optical material without fusing the powder into a mass. The grinding step yields a powder having particle sizes less than 100 microns. The process may further include a step of mixing the optical material with a transparent binder and applying it to a substrate.

Another processing direction comprises the steps of creating chunks of the original fused material and depositing it on a smooth foreign substrate in the form of thin film, such as by evaporation or sputtering, reheating the resultant film to a second temperature below the first temperature but, sufficiently high to form a surface crystallized film, thereby yielding an electron trapping optical material with high optical resolution. The film thicknesses may be in the range of 2-10 microns.

DESCRIPTION OF THE DRAWINGS

The above and other features of the present invention will be more readily understood when the following detailed description is considered in conjunction with the accompanying drawings wherein like characters represent like parts throughout the several views and in which:

FIG. 4 shows a crossection of photoluminescent material disposed on a substrate.

DETAILED DESCRIPTION OF THE PREFERRED EMBODIMENT

Figure 1:
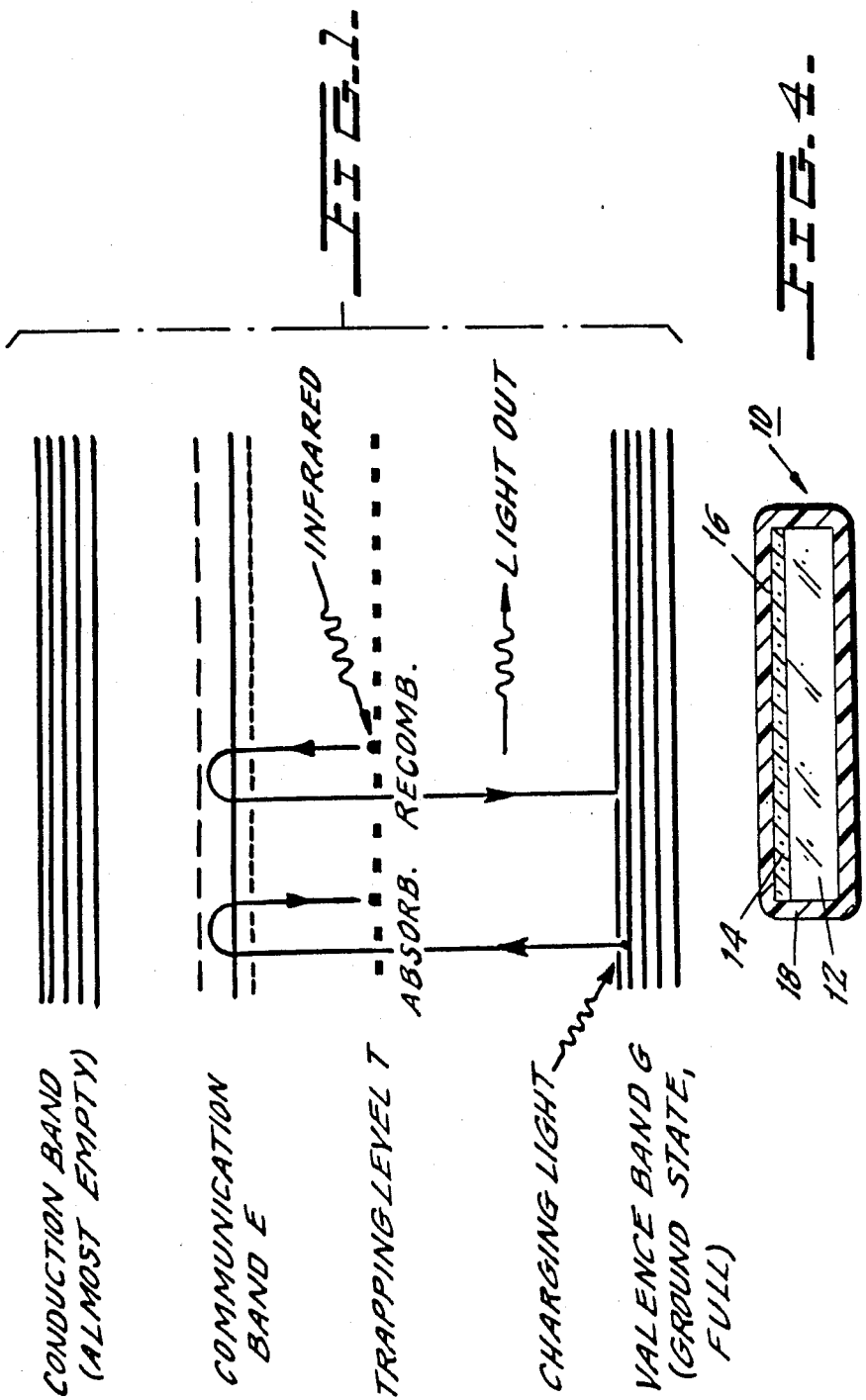
FIG. 1 is a schematic illustrating the principle of operation of the present invention.

FIG. 1 shows the principles of operation of the present invention. The basic multi-crystalline photoluminescent material used has a valence band G full of electrons at a ground state. The material is subjected to visible light which functions to energize certain electrons in the valence band G. An electron shown on the left is originally in a valence band G and is subjected to visible charging light. The electron absorbs a photon raising its energy level to a communication band E where communication takes place with other energized electrons resulting in transitions. As a result of the energizing light, the electron may drop back to a trapping level T or back to the valence band G depending upon the composition of the material and available trapping sites. The electron, if in the trapping level T, will remain isolated from other electrons and trapped until sufficient additional external energy is provided to the electron to raise it back up to the communication band E.

As shown on the right side of FIG. 1, an electron may be stimulated by infrared electromagnetic energy to move it back to the communication band E where it may interact with other electrons and fall back to band G and output a photon of visible light in the process. The materials of the present invention work upon the principle illustrated by FIG. 1 whereby light may be "stored" by the phenomenon of electron trapping and the light may be freed by application of infrared radiation to push the electron up above the trap and allow it to return to the valence band. The number of trapping sites, the depth of the traps, and the probability of transistions occuring in the communication band are all dependent upon the composition of the photoluminescent material used.

As previously mentioned, the photoluminescent material of the present invention comprises a composition of two base materials, a first dopant, a second dopant and a third dopant. A fusable salt, such as lithium fluoride, is useful in that it promotes fusing of the materials at a lower temperature and in a faster time.

The base materials may be selected from the group of alkaline earth metal sulfides and alkaline earth metal selenides. Sulfides such as strontium sulfide and calcium sulfide are preferred over selenides due to the toxic nature of selenides. The use of a mixture of two alkaline earth metal sulfides as the base material significantly improved the light output as will be discussed subsequently.

The first dopant is samarium, the second dopant is selected from the group of europium oxide, europium fluoride, europium chloride, europium sulfide, and the third dopant may be cerium oxide, cerium fluoride, cerium chloride, cerium sulfide, The preferred dopants are europium oxide and cerium sulfide. These dopants provide the best results and are the easiest to work with. The use of the third dopant is not absolutely essential; however, it provides approximately a 10 percent improvement in performance over materials with only the other two dopants.

A photoluminescent material for outputting orange light is made from a mixture having the following composition:
Strontium sulfide: 69 parts
Calcium sulfide: 25 parts
Samarium: 150 parts per million
Europium oxide: 500 parts per million
Cerium sulfide: 500 parts per million
Lithium fluoride: 5.7 parts As used above and throughout this application, "parts" and "parts per million" shall refer to parts by weight unless otherwise noted.

Figure 2:
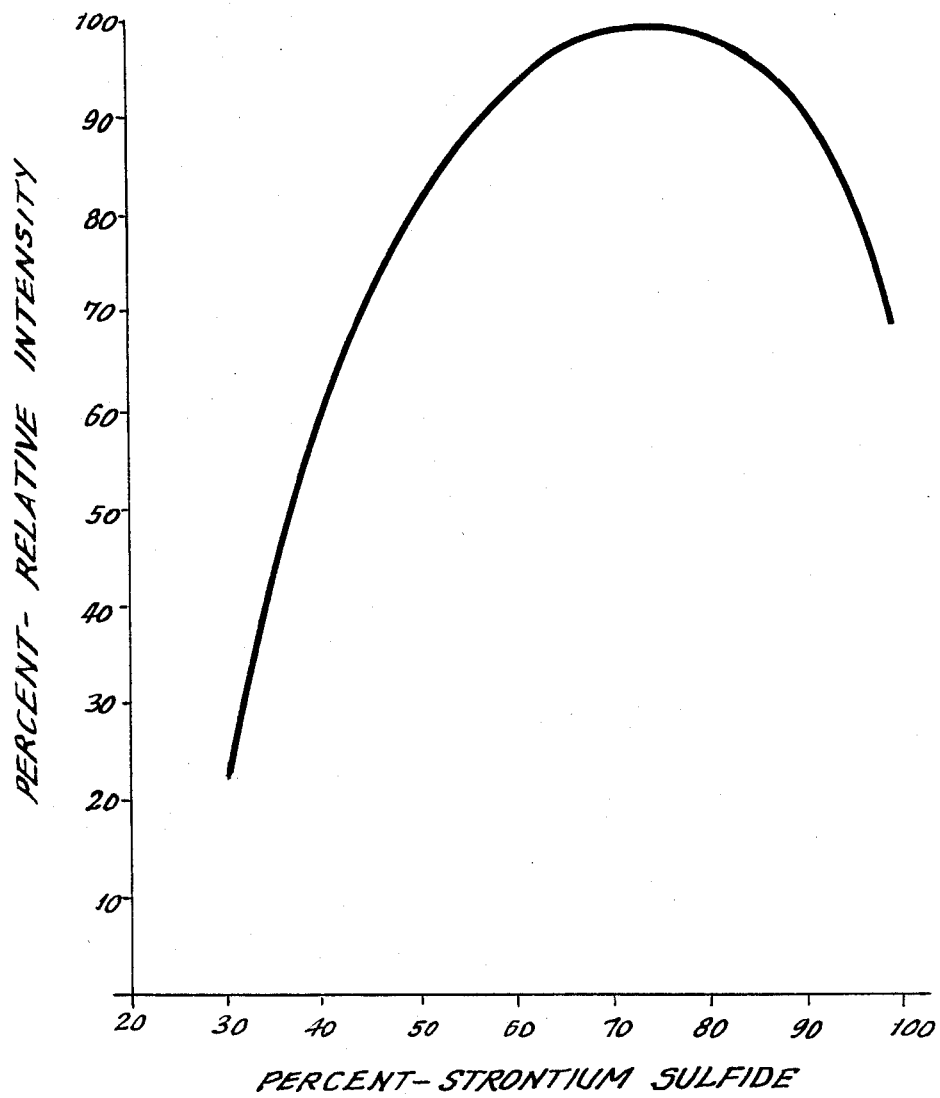
FIG. 2 shows the brightness of the emission as a function of the percentage of strontium sulfide in the base material.

One of the important discoveries in this formulation arises from the fact that the light output, and thereby the efficiency, is very much improved by the proper mixture of two sulfides, as is shown in FIG. 2. The two sulfides apparently form a new crystal (ternary compound). This basic change in the base crystal significantly improves the performance of the optical material. This improvement is apparent when the samarium/europium impurity pair is used without a cerium compound. The introduction of a cerium compound further enhances the efficiency.

The concentration of the fusible salt, such as lithium fluoride, is not critical. The fusible salt could be omitted entirely if higher fusing temperatures and longer fusing time are acceptable.

The mixture is placed into a graphite crucible within a furnace flushed with a dry nitrogen atmosphere (derived from a liquid source) or other dry inert atmosphere such as argon, and heated to between 1100° C. and 1400° C. (preferably 1200° C. for 30 minutes to one hour) such that a fused mass is formed. For longer heating times, the fused mass could be formed at temperatures as low as 950° C. Temperatures as high as 2000° C. could be used to form such a fused mass in shorter times. The use of lithium fluoride will have a significant effect on fusing time and temperatures.

After cooling, the fused mass may be ground using standard techniques into a fine powder having a particle size of 10 to 100 microns if the material is to be used for an infrared sensing card, for an optical viewing screen which requires modest resolution, for optical signal upconversion or, in general, for applications were resolution is not important. The particle size could be larger for large screens, which screens would generate visible images from infrared light.

After grinding, the powdered material is heated to about 300° C. to 700° C. (preferably 600° C.) in the graphite crucible within the nitrogen or other inert atmosphere furnace. This second heating is below the fusing temperature of the material (about 700° C.) and is maintained for 10 to 60 minutes (preferably 30 minutes). This second heating step removes internal stresses and repairs damage done to the crystallites during the grinding step.

After the second heating, the material is cooled and the powdered material is then mixed with a suitable binder or vehicle such acrylic, polyethylene, or other organic polymer.

After the material has been mixed with a tranparent binder, it is applied as a thin coating to a substrate. The coating of the photoluminescent material upon the substrate will preferably be between 1 micron and 500 microns in thickness. Depending upon the use to be made of the material, the substrate may be clear plastic, aluminum oxide, glass, paper, or most any other solid substance.

Particular mention should be made of fusing the particles to certain substrates at elevated temperatures. In this respect, aluminum oxide (alumina) and its crystalline form, sapphire, are specially important. For example, dispersing the photosensitive particles on a sapphire substrate and then heating the structure to about 1000° C. in a dry atmosphere further improves the efficiency of the optical material and expands its potential uses. Use of an alumina or sapphire substrate also allows transmission of the emitted light out of both surfaces of the substrate. Conversely, when fusing is attempted with a quartz substrate, the optical properties are degraded. In general, substrates containing silicon tend to destroy the efficiency of the material above some 800° C.

Grinding is not employed for thin film applications. Here, the original fused material is used in chunks as a source for deposition, for example, by evaporation or sputtering.

The dopants samarium, europium and cerium in the above mixture are used for establishing the communication band and the electron trapping level. Preferably 150 parts per million of samarium are used, but the samarium could alternatively be between 50 parts per million and 500 parts per million, depending on the specific application. The europium and cerium compound concentrations may be between 100 and 1000 parts per million with 200 and 600 parts per million beig preferred and 500 parts per million being the optimal value.

Figure 3:
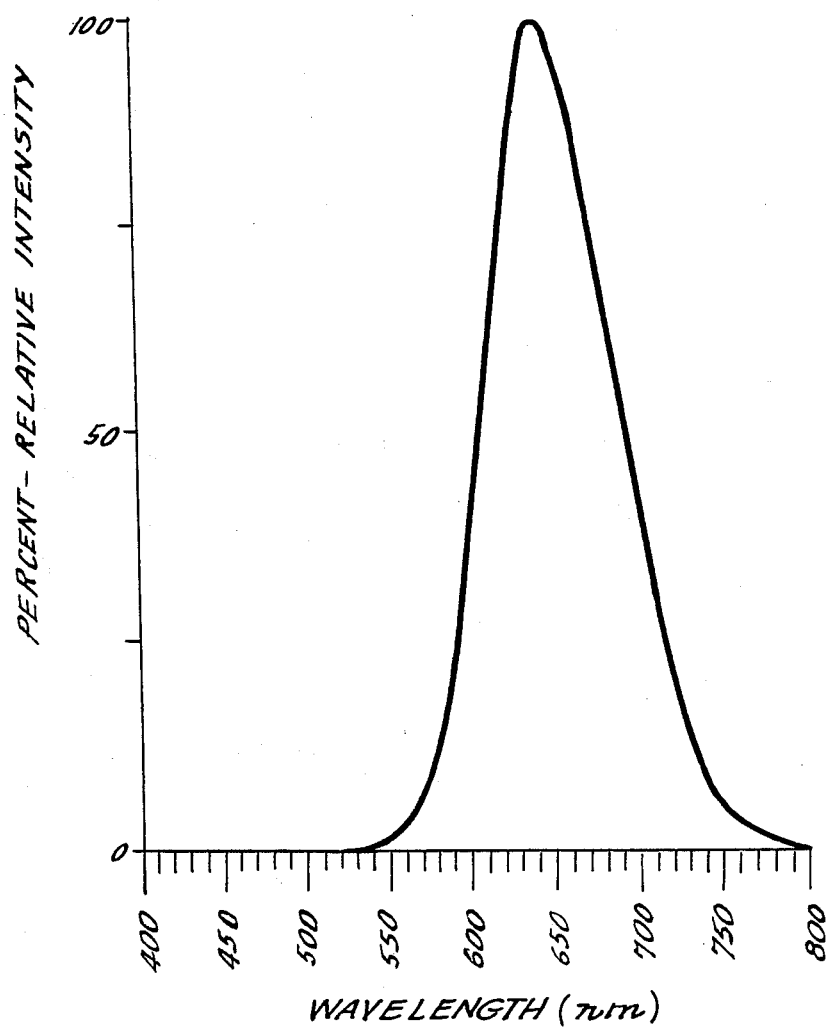
FIG. 3 shows the spectrum of light output by the optical material according to the present invention.

The mixture resulting from the above process provides a depth for electron traps of about 1.1 to 1.2 electron volts below the communication band and has an output spectrum as shown in FIG. 3 which illustrates that the center frequency of the output has a wavelength of approximately 620 nanometer corresponding to an orange light.

FIG. 2 shows the relative performance of the optical material as a function of strontium and calcium sulfide ratios. While the example given describes a specific ratio, it is clear from the functional behavior that deviations from the exact figures will still provide an improved optical performance. It is a basic teaching of this disclosure that by mixing strontium and calcium sulfides, the performance is improved over a wide range of ratios. At 100 percent strontium sulfide the intensity is approximately 70 percent of peak intensity which was experienced at the ratio of the example. Thus, the range of strontium sulfide could be between approximately 45 to 100 percent.

FIG. 4 shows the photoluminescent material disposed on a substrate forming a device 10. As illustrated, the device 10 is a card shown in vertical section having a substrate 12 and the photoluminescent material 14 applied with a transparent binder to the substrate 12. The substrate 12 may be paper, aluminum oxide, plastic, such as PVC, or other solid material. The substrate may be transparent or opaque, if opaque a reflective surface or light color is preferred. The material 14 establishes a planar surface 16. An optional transparent coating 18 may encapsulate the material 14 and substrate 12.

The card, or device 10, of FIG. 4 is useful for aligning scientific or industrial instrumentation having infrared beams. In operation, the card 10 may be "charged up" by exposure of the photoluminescent material 14 to a visible light source such that electrons will be excited and trapped. The card 10 may then be placed in front of an infrared light source. The photoluminescent material 14 will output a visible light at the place where the infrared beam strikes the material, thereby allowing the user to identify exactly where the otherwise invisible beam of infrared radiation is located. Accordingly, the card 10 may be used to calibrate scientific or industrial instruments.

Advantageously, the material of the example and other materials discussed in this application provide a relatively high output light upon stimulation by infrared radiation such that the card can be used with a background of visible light. The light output by the freed electrons in the photoluminescent material 14 will be visible despite the background light. A screen for displaying infrared information as visible light patterns can be made by the same process.

Alternatively, the listed materials (within ranges specified for the example above) are deposited upon a substrate of various forms of aluminum oxide by any known technique including physical or chemical vapor deposition (evaporation, sputtering, etc.), gaseous diffusion, ion beam deposition, molecular beam deposition, and electron beam deposition. The materials and substrate are placed into a furnace and fused under the condition of the example. The material may even fuse without the use of the lithium fluoride of the example. Because the photoluminescent material bonds so well to aluminum oxide, the use of separate binders or vehicles is not necessary.

The structure resulting from the fusing step may optionally be encapsulated in clear plastic to realize the device 10 of FIG. 4. No grinding or additional reheating is necessary. The process may be applied to an aluminum oxide disc to provide an erasable optical memory that could likewise be coated by clear plastic or with various optical layers.

The substrate could be aluminum oxide in the form of sapphire or ceramic in which case the layer of optical memory could be as thin as 0.5 micron resulting in a micro-crystalline form of the optical material.

The optical materials of the present invention may be used for infrared sensing, photography and/or as a memory by using their electron trapping characteristics. The materials may be used in powder form (thick film), and micro-crystalline form (thin film).

Although various specific details have been discussed herein, it is to be understood that these are for illustrative purposes only. Various modifications and adaptions will be apparent to those skilled in the art. Accordingly, the scope of the present invention should be determined by reference to the claims appended hereto.

What is claimed is:

1. An electron trapping photoluminescent material emitting orange light when subjected to infrared radiation, consisting essentially of:
   a base material formed of a mixture of 60–80% by weight of strontium sulfide and 40–20% by weight of calcium sulfide;
   a first dopant of 50–500 parts per million by weight of samarium; and
   a second dopant of 200–600 parts per million by weight of europium oxide.

2. An electron trapping photoluminescent material emitting orange light when subjected to infrared radiation, consisting essentially of:
   a base material formed of a mixture of 60–80% by weight of strontium sulfide and 40–20% by weight of calcium sulfide;
   a first dopant of 50–500 parts per million by weight of samarium;
   a second dopant of 200–600 parts per million by weight of europium oxide; and
   lithium fluoride in an amount of up to 10 parts by weight per 100 parts of base material.

3. An electron trapping photoluminescent material emitting orange light when subjected to infrared radiation, consisting essentially of:
   a base material formed of a mixture of 60–80% by weight of strontium sulfide and 40–20% by weight of calcium sulfide;

a first dopant of 50-500 parts per million by weight of samarium; and a second dopant of 200-600 parts per million by weight of europium oxide disposed upon a substrate.

4. The photoluminescent material of claim 3, wherein the substrate is aluminum oxide.

5. The photoluminescent material of claim 3, wherein the substrate is alumina.

6. The photoluminescent material of claim 3, wherein the substrate is sapphire.

7. The photoluminescent material of claim 3, wherein the material is from 0.5 micron to 500 micron in thickness.

* * * * *